(12) United States Patent
Goodwin

(10) Patent No.: US 10,591,826 B2
(45) Date of Patent: Mar. 17, 2020

(54) ENCODER HEAD WITH A BIREFRINGENT LENS ELEMENT AND EXPOSURE SYSTEM UTILIZING THE SAME

(71) Applicant: Nikon Corporation, Tokyo (JP)

(72) Inventor: Eric Peter Goodwin, Oro Valley, AZ (US)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/889,412

(22) Filed: Feb. 6, 2018

(65) Prior Publication Data

US 2018/0181006 A1 Jun. 28, 2018

Related U.S. Application Data

(63) Continuation-in-part of application No. 15/800,480, filed on Nov. 1, 2017, which is a continuation-in-part
(Continued)

(51) Int. Cl.
*G03F 7/20* (2006.01)
*G02B 27/28* (2006.01)
(Continued)

(52) U.S. Cl.
CPC ..... *G03F 7/70316* (2013.01); *G01D 5/34715* (2013.01); *G02B 1/08* (2013.01);
(Continued)

(58) Field of Classification Search
None
See application file for complete search history.

(56) References Cited

U.S. PATENT DOCUMENTS 8,860,949 B2 * 10/2014 Ishizuka ............... G01D 5/266
356/499
9,746,348 B2 * 8/2017 de Groot ............... G01D 5/266
(Continued)

*Primary Examiner* — Shawn Decenzo
(74) *Attorney, Agent, or Firm* — Yakov Sidorin; Quarles & Brady LLP

(57) ABSTRACT

An encoder head configured for use with a lithographic exposure tool. The head is devoid of the multiplicity of optical corner-cubes and includes, instead, a single, geometrically substantially perfect cuboid of optically-isotropic material complemented, in operation, with a birefringent lens to form a contraption that, as a unit, splits a single beam of light delivered to the contraption into four measurement (sub-)beams of light (two in xz-plane, two in yz-plane) and causes each of measurement sub-beams to interact with the wafer-stage diffraction grating at the same location twice: upon the first pass by the grating and upon the second pass by the grating. The use of the contraption solves problems of (i) structural complexity of a conventional encoder head for use in an exposure tool, (ii) burdensome alignment of the multitude of optical prisms in the process of forming such encoder head, and (iii) cyclic non-linear errors associated with measurements involving conventional corner-cubes-based encoder heads while, at the same time, reducing the
(Continued)

geometrical footprint of the encoder head. The contraption is complemented with a birefringent prismatic element positioned across the axis of the contraption between the cuboid and the birefringent lens.

38 Claims, 9 Drawing Sheets

Related U.S. Application Data of application No. 15/483,887, filed on Apr. 10, 2017, now Pat. No. 10,162,087.

(60) Provisional application No. 62/455,960, filed on Feb. 7, 2017, provisional application No. 62/416,847, filed on Nov. 3, 2016, provisional application No. 62/320,985, filed on Apr. 11, 2016.

(51) Int. Cl.
  *G02B 19/00* (2006.01)
  *G02B 1/08* (2006.01)
  *G01D 5/347* (2006.01)

(52) U.S. Cl.
  CPC ....... *G02B 19/0085* (2013.01); *G02B 27/283* (2013.01); *G03F 7/70308* (2013.01); *G03F 7/70716* (2013.01); *G03F 7/70775* (2013.01)

(56) References Cited

U.S. PATENT DOCUMENTS

| | | | |
|---|---|---|---|
| 2004/0075708 A1* | 4/2004 | Arakawa | B41J 29/393 347/19 |
| 2005/0087681 A1* | 4/2005 | Chin | G01D 5/34715 250/231.13 |
| 2006/0209310 A1* | 9/2006 | Muenz | B23K 26/0604 356/521 |
| 2010/0297561 A1* | 11/2010 | Beerens | G03F 7/70775 430/322 |
| 2013/0048842 A1* | 2/2013 | Goodwin | G01D 5/34723 250/231.1 |
| 2013/0114062 A1* | 5/2013 | Liesener | G01D 5/38 355/72 |
| 2015/0276385 A1* | 10/2015 | Goodwin | G01B 11/14 356/614 |
| 2016/0102999 A1* | 4/2016 | Liesener | G01D 5/266 356/488 |
| 2017/0030744 A1* | 2/2017 | Kimura | G01D 5/266 |
| 2017/0097574 A1* | 4/2017 | Goodwin | G03F 7/70141 |
| 2018/0061627 A1* | 3/2018 | Goodwin | G01D 5/38 |
| 2018/0066966 A1* | 3/2018 | Oyama | G01D 5/38 |
| 2018/0181006 A1* | 6/2018 | Goodwin | G03F 7/70775 |

\* cited by examiner

300: Lens aperture is trimmed to match dimensions of the retroreflecting glass block 210

ENCODER HEAD WITH A BIREFRINGENT LENS ELEMENT AND EXPOSURE SYSTEM UTILIZING THE SAME

CROSS-REFERENCE TO RELATED APPLICATIONS

This patent application claims priority from and benefit of the U.S. Provisional Patent Application No. 62/455,960 filed on Feb. 7, 2017, and is a continuation in part of U.S. patent application Ser. No. 15/800,480 which was filed on Nov. 1, 2017, which claims the benefit of U.S. Provisional Patent Application No. 62/416,847 filed on Nov. 3, 2016. The U.S. patent application Ser. No. 15/800,480 is a continuation-in-part of U.S. patent application Ser. No. 15/483,887 filed on Apr. 10, 2017, which claims the benefit of and priority from U.S. Provisional Patent Application No. 62/320,985 filed on Apr. 11, 2016. The disclosure of each of the above-identified patent applications is incorporated herein by reference.

TECHNICAL FIELD

The present invention relates to encoder heads and, in particular, to encoder heads including an optically-birefringent lens.

RELATED ART

Lithographic exposure apparatus (or exposure tools, for short) are commonly used to transfer images from a reticle onto a semiconductor wafer during semiconductor processing. A typical exposure apparatus, used for transfer of a pattern from a reticle onto a substrate of interest (interchangeably—a target substrate or a wafer, such as a semiconductor wafer during the semiconductor processing) includes an illumination source, a reticle stage assembly (that positions a reticle within the apparatus), an optical assembly containing the so-called projection optics, and a wafer stage assembly (that positions the target substrate or a wafer). The exposure apparatus also includes a measurement system (that monitors positions of the reticle and the target substrate) that employs an encoder head, and a control system that governs operations of various assemblies to adjust, when required, mutual positioning of the reticle and the target substrate. The geometrical features of patterns transferred from the reticle onto the target substrate are extremely small, which imposes extremely tight requirements on precise positioning of the target substrate and the reticle to manufacture high quality patterned semiconductor wafers.

Accuracy of the measurement system employed by the exposure apparatus constantly requires improvement (which is partly driven by advances in design of an exposure tool), while relatively small size, simplicity of construction, a need for reduced number of moving parts and high sensitivity remain as practical limitations.

SUMMARY

Embodiments provide an optical system comprising (i) a first optical sub-system including a combination of a substantially geometrically-perfect optically-isotropic cuboid and a lens, said lens containing at least one birefringent lens element; and an optical surface disposed in optical communication with said cuboid to form a first beam of light by redirecting a portion of an input beam of light, which has traversed the first sub-system once and which is incident at a first chosen area of the optical surface, towards the first sub-system. Embodiment may further comprise a birefringent prismatic element disposed between the cuboid and the lens. The birefringent prismatic element may include a birefringent plane-parallel plate configured to maintain a vector of polarization of light, incident onto said plate perpendicularly to a surface of the plate, upon transmission of such light through said birefringent plane-parallel plate while, at the same time, to change a vector of polarization of light incident onto said surface obliquely. Embodiments also disclose a lithographic exposure system comprising the encoder head configured to include such optical system and further comprising a moveable stage carrying the optical surface configured as a surface of a diffraction grating.

Embodiments provide an encoder head configured for use in a lithographic exposure tool that includes a wafer-stage carrying a diffraction grating, the encoder head comprising an optically-isotropic cuboid, and a birefringent lens. In one embodiment, the cuboid is a substantially geometrically perfect optical cuboid and the birefringent lens includes an optical doublet lens.

Embodiments additionally provide an encoder head for use in a lithographic exposure system in optical communication with a diffractive grating of the exposure system and the exposure system employing such encoder head. The encoder head comprises a first optical sub-system containing a combination of (i) a single, substantially geometrically perfect cuboid of optically isotropic material, said cuboid having an axis; (ii) an optically-birefringent plane-parallel plate disposed substantially symmetrically about the axis; and (iii) an optically-birefringent lens disposed symmetrically about the axis. Here, the first optical subsystem is positioned to transmit light from an input light beam, delivered to the encoder head along the axis, to interact with the diffractive grating for a first time at a first area on a surface of the diffractive grating and, as a result of such interaction, to form a first beam of light directed from the diffraction grating to the first optical sub-system. Additionally, when the first beam of light, that has traversed the first sub-system twice, is incident at the diffraction grating to interact with the surface of the diffraction grating for a second time at a second area, the first and second area overlap each other.

BRIEF DESCRIPTION OF THE DRAWINGS

The invention will be more fully understood by referring to the following Detailed Description of Specific Embodiments in conjunction with the not-to scale Drawings, of which.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

Figure 7:
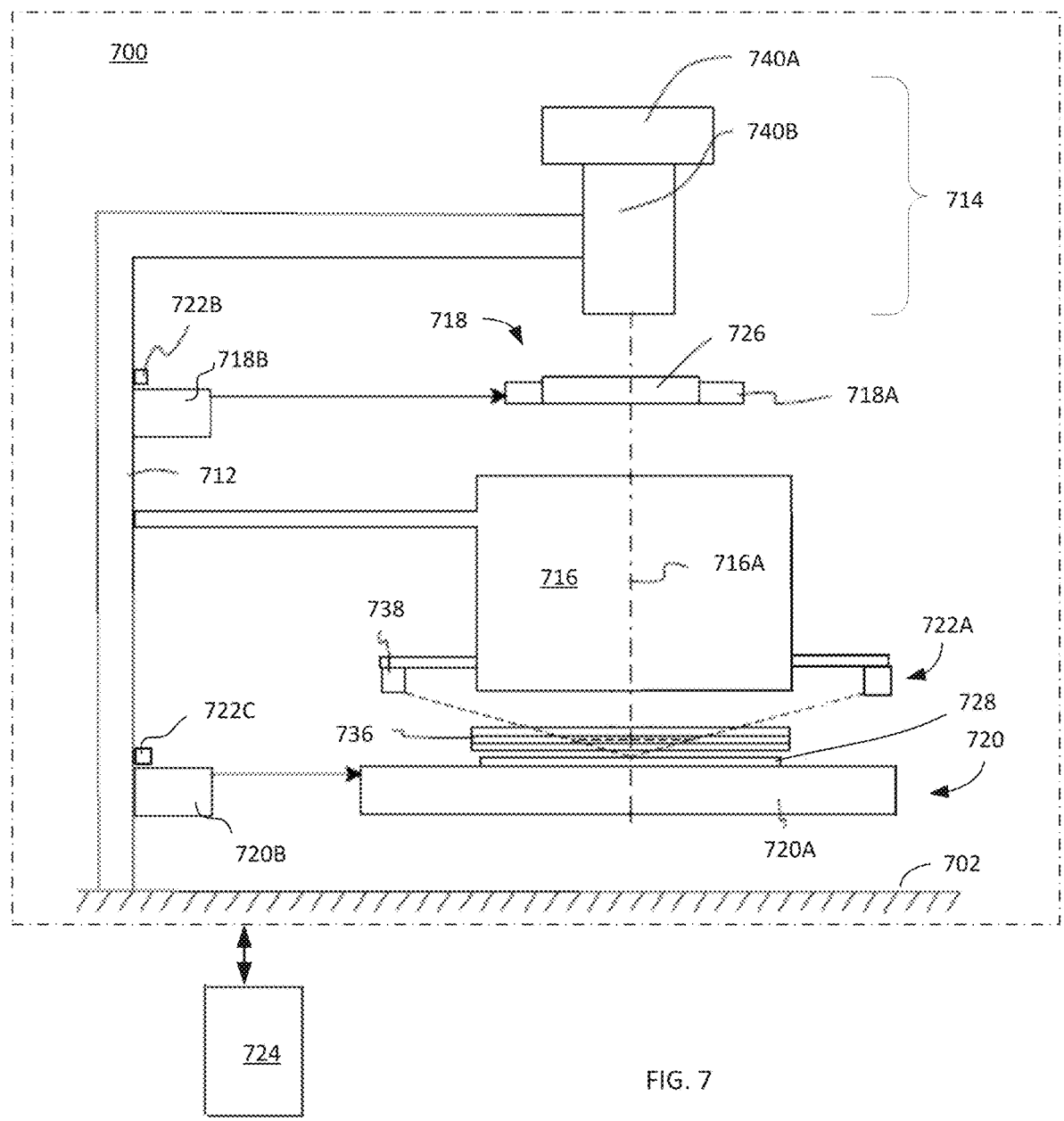
FIG. 7 is a diagram schematically illustrating a lithographic exposure apparatus.

To appreciate the context and operational environment in which an embodiment of the proposed encoder head(s) may be used, a general description of a typical lithographic exposure apparatus may be useful. An example of the exposure apparatus (also interchangeably referred to as a lithographic apparatus), which may employ a conventional encoder head—the one equipped with individual corner cube retroreflectors—as well as, optionally, an autofocus system (AFS) for measurements of wafer displacements is provided in PCT/US2012/043186, which is incorporated herein by reference. FIG. 7 schematically illustrates, in reference to the provided Cartesian system of coordinates, a schematic non-limiting illustration of such exposure apparatus.

The exposure apparatus 700 includes an apparatus frame 712, an illumination system 714 (also referred to as irradiation apparatus), an optical assembly 716, a reticle stage assembly 718, a wafer stage assembly 720, a positioning system (shown as a combination of several units including systems 722A, 722B, 722C), and a control system 724. The design of the components of the exposure apparatus 700 can be varied to suit specific requirements. The exposure apparatus 700 may be mounted to/on a mounting base 702, such as the ground, a base, or floor, or some other supporting structure.

Apparatus Frame. The apparatus frame 712 is rigid and supports and/or houses at least the reticle stage assembly 718, the optical assembly 716, the wafer stage assembly 720, and the illumination system 714 above the mounting base 702.

Illumination System. The illumination system 714 includes an illumination source 740A and an illumination optical assembly 740B. The illumination source 740A emits radiation to which the wafer/work-piece 728 is exposed and which is guided by the illumination optics of the assembly 740B to the optical assembly 716, along an optical axis 716A. On its way to the optical assembly 716, the beam of radiation illuminates a portion of the reticle 726 to gain spatial pattern of irradiation representing the pattern of the reticle 726.

The illumination source 740A can be, for example, any of a g-line source (436 nm), an i-line source (365 nm), a KrF excimer laser (248 nm), an ArF excimer laser (193 nm), a F2 laser (157 nm), or an EUV source (13.5 nm), or another preferred source of radiation. The wafer-illuminating (exposure) light may be provided at about 193 nm (by an ArF excimer laser system, for example) light (with a wavelength of 193 nm), but it can also include ultraviolet light such as described in, for example, U.S. Pat. No. 7,023,610. The source 740A of illuminating light may exploit harmonic frequency conversion or utilize an optical-fiber based amplifier, to produce radiation at a predetermined wavelength. Alternatively, the illumination source 740A can generate charged particle beams such as an x-ray or an electron beam. For instance, in the case where an electron beam is used, thermionic emission type lanthanum hexaboride (LaB6) or tantalum (Ta) can be used as a cathode for an electron gun. Furthermore, in the case where an electron beam is used, the structure could be such that either a mask is used or a pattern can be directly formed on a substrate without the use of a mask.

Optical Assembly. The optical assembly 716 projects and/or focuses the light passing through the reticle 726 onto the work piece (wafer) 728. Depending upon the design of the exposure apparatus 700, the optical assembly 716 can scale (i.e., to magnify or reduce, with a specific coefficient) dimensions of the pattern of the reticle 726. In a specific implementation, the optical assembly 726 may simply optically relay the pattern of the reticle 726 onto the wafer (i.e., the optical assembly 726 may have a unit magnification, if desired).

Reticle Stage Assembly. The reticle stage assembly 718 holds and positions, (with the use of a reticle stage mover assembly 718B) the reticle stage 718A that retains the reticle 726 relative to the optical assembly 716 and the wafer 728. The reticle stage mover assembly 718B can be designed to move the reticle stage 718A along any of the x, y, z axes.

Wafer Stage Assembly. The wafer stage assembly 720 holds and positions (with the use of a wafer stage mover 720B) the wafer 728 with respect to the image of the illuminated portion of the reticle 726 projected onto the wafer. The wafer stage mover 720B can be designed to move the wafer 728 along any of the x, y, z axis. In one embodiment, the wafer 728 can be scanned while the wafer stage assembly 720 moves the wafer 728 along the y-axis.

Positioning System. The positioning system (722A, 722B, 722C) monitors movement of the reticle 726 and the wafer 728 relative to the optical assembly 716 or some other reference. As shown in FIG. 7, the position system 722 includes (i) an AFS 722A that maps the topography of the wafer 728 relative to the optical assembly 716 along the Z axis (which is collinear with the optical axis 716A), about the X axis, and about the Y axis prior to exposure of the wafer with improved accuracy; (ii) a reticle measurement system 722B (only a portion of which is illustrated) that monitors the position of the reticle stage 718A and the reticle 726; and (iii) a wafer measurement system 722C (only a portion of which is illustrated) that monitors the position of the wafer stage 720A along the X and Y axes, and about the Z axis. Due to operation of the position system, the wafer stage assembly 720 can be controlled to position the wafer 728 with improved accuracy. The positioning system 722 can utilize laser interferometers, encoders, autofocus systems, and/or other measuring devices.

One implementation of the autofocus system 722A includes a reference system 736 configured to provide a reference signal used in conjunction with and related to the measurement of any changing operational parameter of the AFS 722A, but not the position of the wafer 728, along the optical axis 716A. The AFS 722A further includes a measurement system 738, which provides a measurement signal used in conjunction with and related to the measurement of anything changing in the AFS 722A including (the change of, if present) position of the wafer 728 along the optical axis 716A. By comparing the reference and measurement signals, the position of the wafer 728 is measured, which is accompanied with reduction of the stability requirements for many of the components of the AFS 722A.

A typical measurement system 738 may include an encoder assembly (not shown) that measures, in operation, the position of a work piece (as shown—the wafer 728). For example, in some embodiments, the encoder assembly can be designed to monitor and/or measure the position of the work piece along two axes (e.g., along the x- and y-axes). Additionally and/or alternatively, the encoder assembly can be designed to measure and/or monitor the position of the work piece 728 along all three axes (i.e., to specify the 3D position of the work piece 728).

The conventional measurement system 738 may also include a stage grating (not shown) that is secured to a side of the wafer stage 720A (of the assembly 720) that retains the work piece 728, and one or more fixed encoder heads (not shown). The number of encoder heads and their mutual positioning and orientation can be varied according to the design of the exposure apparatus 700 and/or the measurement system 738, and the amount of travel of the stage 720A along x- and y-axes. The use of multiple encoder heads enables the encoder assembly to more accurately measure the position of the stage 720A, and thus the position of the work piece 728 that is retained by the stage 720A. Examples of the structure(s) of the measurement system 738 and encoder head(s) are discussed in detail in U.S. 2014/0049762, which is incorporated herein by reference, and will not be addressed here additionally. Depending on the details of a particular implementation of the overall system, the encoder head may be provided on the wafer stage 720A and the grating may be provided on a fixed metrology frame.

Control System. The control system 724 is operably connected to and governs the operation of at least the illumination system 714, the reticle stage assembly 718, the wafer stage assembly 720, and the positioning system 722. The control system 724 acquires measurement data, from the positioning system 722, that represent position and/or orientation and/or movement of the reticle 726 and/or wafer 728 with respect to the optical assembly 716 or another chosen reference. Based on these data, the control system 724 controls the assemblies 718, 720 to precisely position the reticle 726 and the wafer 728. The control system 724 can include one or more processors and electronic circuits, at least one of which may be specifically programmed to perform steps of data acquisition, data processing, and control of operation of the components of the apparatus 700.

Generally, the exposure apparatus 700 can be used as a scanning type photolithography system for optical transfer of a spatial pattern from the reticle 726 onto the wafer 728, with the reticle 726 and the wafer 728 moving synchronously. Alternatively, the exposure apparatus 720 can be used as a step-and-repeat type photolithography system that exposes the reticle 726 while the reticle 726 and the wafer 728 are stationary. The use of the exposure apparatus 700, however, is not limited to a photolithography system for semiconductor manufacturing and can include, as a non-limiting example, the use as an LCD photolithography system that projects a liquid crystal display device pattern onto a rectangular glass plate or a photolithography system for manufacturing of a thin film magnetic head.

Figure 8A:
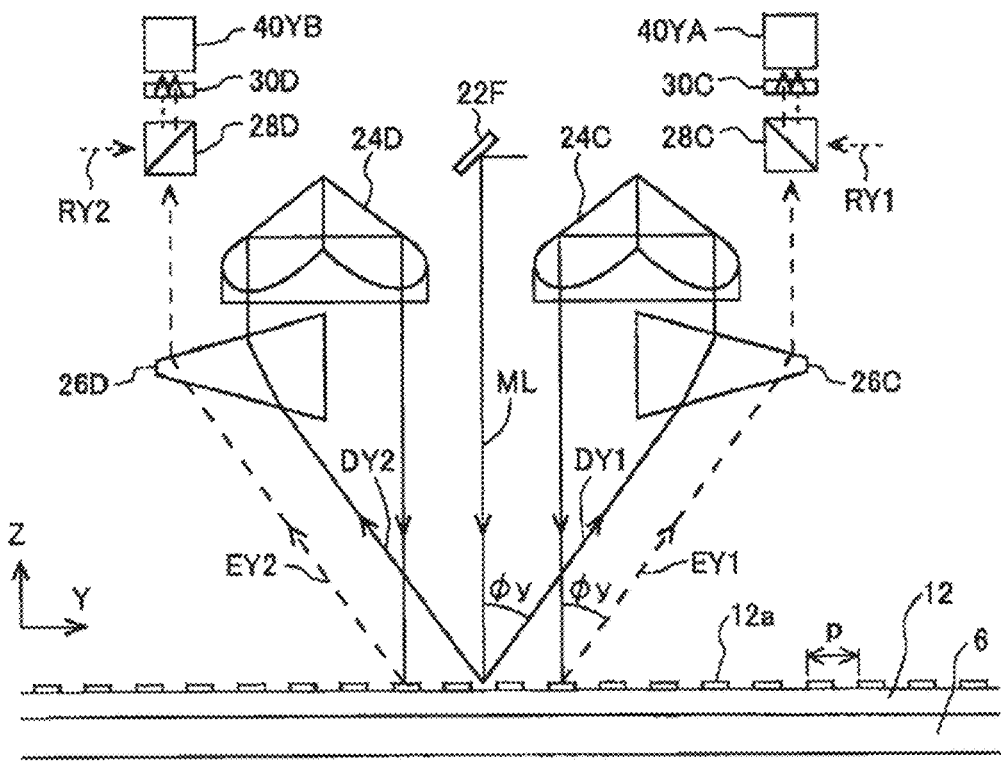
FIG. 8A is a schematic diagram of a portion or component of an encoder head of related art that utilizes multiple individual corner-cube retroreflectors and other stand-alone prismatic elements.
Figures 8B, 8C:
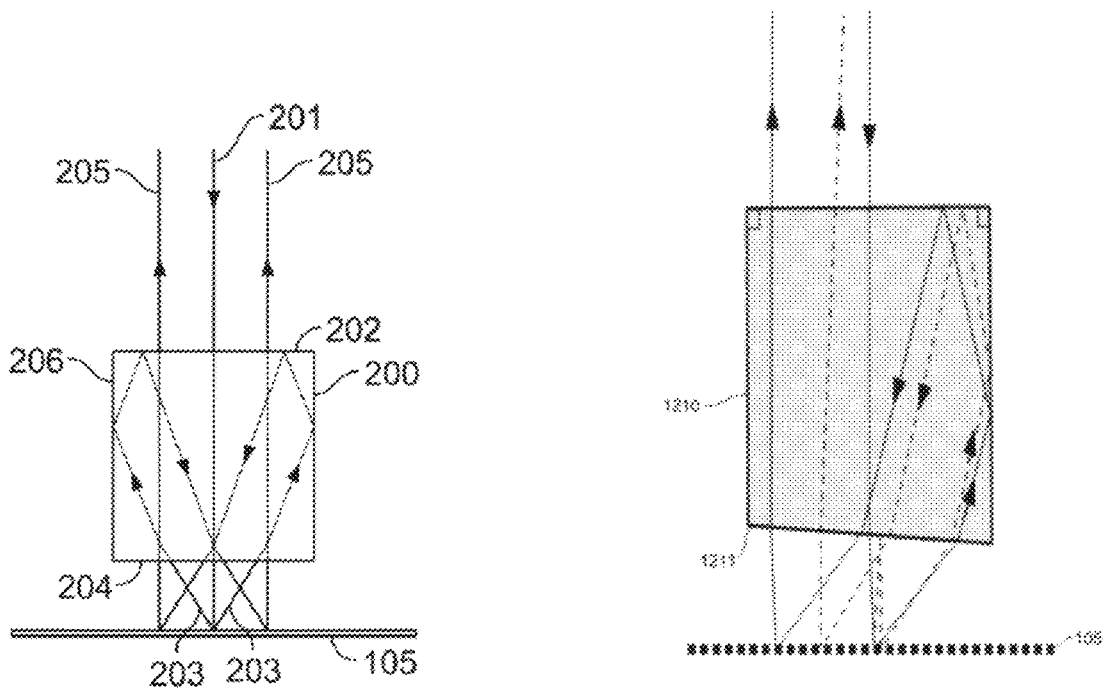
FIGS. 8B and 8C provide schematic diagrams of portions, of an encoder head of related art, each of which utilizes a monolithic optical component with the corners configured to operate as conventional retro-reflectors for light propagating internally through such optical component.

In order to measure x-, y-, and/or z-coordinates or other positional parameters of a stage carrying an object (and, in a specific case, those of a wafer-stage) moving in the reference system of the exposure tool during its operation, a two-dimensional (2D) diffraction grating is typically employed in conjunction with such stage. This grating may be interchangeably referred to below as a wafer-stage grating. Each light beam that is nearly normally incident onto such grating forms, in diffraction at the grating, four primary first-order-diffraction beams: two diffracted beams representing respectively +/−1 orders of diffraction in the xz-plane and two diffracted beams representing respectively +/−1 orders of diffraction in the yz-plane. Light efficiency is rather critical during the measurement of the wafer-stage positioning, so ideally all four of these first-pass diffraction orders are used as part of the measurement (as opposed to creating multiple first pass beams, one for each measurement). The basic principle of such measurement requires the measurement light beam to pass off/be diffracted by the wafer-stage grating twice (while being retroreflected towards the grating in between the two occurrences of the diffraction) so that any change of tip or tilt of the grating does not result in or cause a corresponding tip or tilt of the measurement beam of light. This is where the related art took advantage of the use of "corner cube reflectors" to effectuate such retroreflection. See, for example, FIG. 8A (corresponding to FIG. 2B from U.S. 2013/0128255), which shows the use of four individual constituent corner cube retroreflectors and four shear-correction prisms required to effectuate four measurements, in the xz- and yz-planes, based on a single input beam of light. (For description of all optical elements and the overall system of FIG. 8A, the reader is referred to the description of FIG. 2B of U.S. 2013/0128255). Notably, all these optical elements have to be tediously aligned relative to one another to provide for accurate and reliable measurement(s). Similarly, the use of a monolithic optic such as an optical cuboid with corners configured to perform as cataphotes for light internally incident onto such corners has been utilized by, for example, U.S. Pat. No. 9,201,313 (two embodiments of such monolithic optical component utilized in encoder heads of U.S. Pat. No. 9,201,313 are shown in FIGS. 8B, 8C, with element 105 designating the wafer-stage diffraction grating).

Figure 9A:
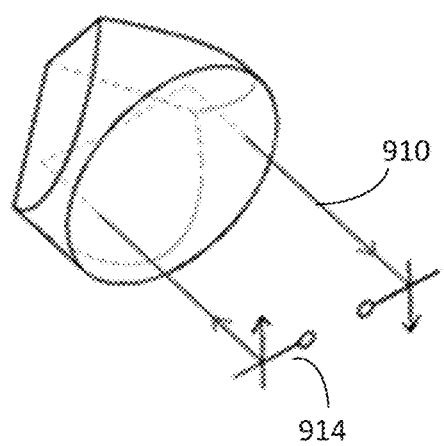
FIGS. 9A, 9B provide schematic examples of typical stand-alone, individual corner-cube retroreflecting structures.
Figure 9B:
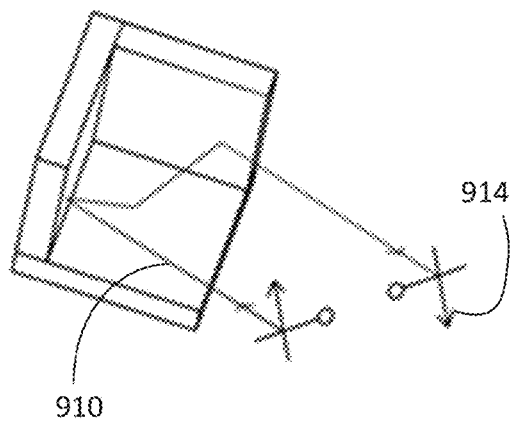

For the purposes of this disclosure, and as understood in the art, an individual corner retro-reflector (or an individual corner-cube prism, or an individual cataphote) is conventionally defined as a stand-alone optical component configured to return a beam incident thereon directly in a retroreflected fashion, towards the point of origin of such beam (with possible lateral displacement of the beam), regardless of the beam's angle of entry into the corner-cube retroreflector. Diagrams of a typical individual cataphotes is provided in FIGS. 9A, 9B, where arrows 910 indicate either input or output beams of light and schematics 914 illustrate the preservations or change of parity and orientation of an image formed in light reflected by the corner cube with respect to those of an object. In reference to FIGS. 8B, 8C it is appreciated that the internal corners of the components of FIGS. 8B, 8C operate on internally-propagating light beams in the same exact fashion.

General Considerations

Encoder heads employed in the related art up to-date are configured for measuring a position of a target component or workpiece (disposed, for example, on a wafer-stage) or a position of the wafer-stage itself with sub-nm accuracy. These encoder heads are typically structurally complex and require the use of many optical components and/or tight operational tolerances and difficult alignment of such components. Optical engineers find themselves in a tight spot in attempting to satisfy several operational requirements that should better be met for an encoder head to work properly, while continuing the quest for reducing the complexity and cost of the encoder heads. The important operational requirements may include:

1. Two passes, of the measurement beam of light, off or by the measurement diffraction grating (sometimes referred to as a wafer-stage grating) with a return, retroreflection of light occurring in between these two passes, in order to remove tip/tilt errors from the measurement beam,
2. Utilizing the measurement beam with the largest diameter possible (for a given encoder head package size) to average the results of the measurement over as many grating grooves/rulers/line as possible; and, last but not least,
3. Achieving high light efficiency (as a 2D diffraction grating is at best about 20% efficient on each of the 2 passes of the measurement beam of light by the grating).

A person of skill in the art is also often concerned with some optional requirements, the satisfaction of which is sometimes desirable. These may include:

1. Reducing the size of the resulting encoder head package to the smallest possible;
2. Reducing the number of utilized optical components;
3. Increasing the relative ease of alignment by utilizing double pass elements, etc.
4. Utilization of all 4 diffraction orders from the $1^{st}$ pass beam (to increase light efficiency), and
5. Ensuring the operational ease of fiber-centered input/output of light into the encoder head unit (if such input-output is, indeed, employed).
6. Ensuring that footprints of multiple beams, incident onto the 2D diffraction grating overlap at the grating as much as possible (and in a specific implementation—to be substantially the same and/or congruent) to minimize the area representing the overall, summed footprint of the beams and to reduce or even eliminate geometric errors caused by otherwise having first and second pass beams to interact with the different areas of the grating.

The appreciation of the fact that additional, reference light beams are also necessarily present and/or formed in the encoder head system begs additional questions: Is it required for such reference beams of light to be also incident on/interact with the diffraction grating, thereby removing z- (that is, axial) sensitivity of the measurement? Can the reference beams of light be generated with high efficiency while requiring minimal space in the package of the overall encoder head? The realization of an unsolved need to prevent parallel stray light beams from being introduced into a measurement system and causing non-linear errors in the measurement adds another level of deliberation of an operably-successful design of an encoder head.

All the above are the considerations and motivations behind the design of the embodiments discussed below. The implementations are based on the realization that configuring the encoder head around the use of a single, solid block of optically-transparent isotropic material (such as glass or optical-grade plastic), which is complemented by an optically-anisotropic lens, to effectuate the double-pass reflection of light within the encoder head not only greatly reduces the required number of high-quality optical components in comparison with that used in the related art, but also mitigates the stray noise while simultaneously allowing for increase of size(s)/dimension(s) of the measurement beam of light employed by the encoder head, thereby solving at least these the structural and operational problems remaining in exposure systems of the related art.

The disclosure presented below addresses the problems of establishing the CNLE-free measurement signals, a small number of simple optical components, a small overall package size and overlapping all measurement beams on the same grating location by defining an assembly in which birefringent lens element are combined with/complement an optically-transparent single block optically-isotropic light-retroreflector into a compact encoder head while causing the overlap between the $1^{st}$ and $2^{nd}$ pass beams on or at the measurement diffraction grating of the exposure tool.

Operational problems and limitations, caused by the use of multiple individual optical corner-cube retroreflectors in a conventional encoder head of a lithographic exposure tool to form four diffracted measurement beams (required for the determination of change of spatial orientation of a target component with respect to the encoder head) are solved by utilizing for the same purpose a single, substantially geometrically-perfect block of isotropic optical material in combination with optically-anisotropic lens element that is disposed, in operation, between the block and the target component.

One addressed need is the need to utilize multiple spatially-distinct optical corner cube retroreflectors, each of which is produced at a high cost. Such need is now substituted with a use of an optical system that includes a single optically-isotropic optical block to which a lens containing a birefringent lens element is either pre-attached or simply juxtaposed.

Another addressed need is the need to reduce the operational cost and time associated with necessary mutual alignment of multiple optical corner cube retroreflectors (with respect to both the input light beam, produced by a light source used with the encoder head, and diffracted beams, formed from such input light beam by a wafer-stage diffraction grating of the exposure system). Such mutual alignment is now replaced with a simple alignment, with respect to only the input light beam, of the optical system that includes a single optically-isotropic optical block in combination with a birefringent lens.

Yet another addressed need is the need to overcome a limitation, conventionally imposed by the structure of encoder head (that contains multiple corner cube retroreflectors) on the working distance operationally available between the encoder head and the diffraction grating of the exposure tool for a given diameter of the input beam of light. Embodiments of the current invention may allow for decreased working distance, or alternatively or in addition, a substantial reduction of the overall size of the encoder head for a chosen diameter of the input beam as compared with encoder head embodiments of related art.

Furthermore, the proposed design ensures that an axis along which a(n output) measurement beam of light is returned by the measurement arm of the encoder head towards the optical detection unit angularly deviates from the axis along which the (input) measurement beam of light enters the measurement arm of the encoder head or, stated differently, that at least the measurement arm of the encoder head, as a whole, does not perform the act of what is understood by "retroreflection of light", to help prevent parallel stray beams from being introduced into the light-measurement system from unwanted reflections that make multiple passes through at least part of the encoder head and still emerge parallel to the measurement beam(s).

Unless specified otherwise, the terms "single element", "single optical element", "sole element" and similar terms are defined to refer to an optical body that is monolithic— that is, consisting of one piece (solid or unbroken, as opposed to one integrated or constructed from several pieces each of which has, on its own, identifiable geometrical boundaries) of the same, single optical material—and that is characterized by spatially uniform optical and mechanical properties. Accordingly, an optical element formed as a result of combining several individual optical elements into one integral whole may not be considered to be a single and/or sole optical element as defined herein.

In particular, the presently implemented embodiment(s) may solve problems of (i) structural complexity of a conventional encoder head for use in an exposure tool and (ii) burdensome alignment of the multitude of optical prisms in the process of forming such encoder head by substituting the multiplicity of corner-cubes with a single, substantially geometrically-perfect cuboid of glass that, in operation with the diffraction grating of the wafer-stage, simultaneously forms four interferometric signals for measuring x-, y-, and z-positions of a wafer-stage grating relative to the encoder head. Unless specified otherwise, the term "cuboid" is used to define a parallelepiped of which all faces are rectangular. The term "substantially geometrically perfect", when used in reference to a shape of a particular optical body, denotes a minimized deviation from the otherwise-determined or known shape of such body as accepted in results of fabrication of such body employed as known in the art. One example would be an optical cube with a corner as a result of internal reflection at which the beam of light is returned along the same axis along which it arrived when impinging on the corner, with a possible angular deviation not exceeding, for example, 3 arcseconds (or, sometimes, even 1 arcsecond); the edges of such optical cube are not beveled, since the incident beam is nearly centered on the corner of the cuboid.

Implementations of the invention are turning on the use of a birefringent element, configured to be a part of the encoder head, to make a process of "retroreflection of light" by the encoder head imperfect, or frustrated, in that a beam of light entering the encoder head and a beam of light exiting the encoder head propagate along two different lines or axes that are not parallel to one another. The purpose of ensuring such frustration of the process of reflection of light by the encoder head is to facilitate prevention of formation of coherent, parallel stray beams of light (within the encoder head) that cause cyclic non-linear error (CNLE).

In related art (see U.S. provisional application 62/416,847, the disclosure of which is incorporated herein by reference), the plurality of birefringent elements (each shaped as an optical wedge) was used for this purpose. The mutual disposition of the plurality of birefringent elements required by the related art is quite specific: for proper operation of the related-art embodiment(s), the beam of light incident onto the encoder head must traverse it and reach the diffraction grating of the lithographic exposure tool for the first time without encountering or traversing or irradiating these birefringent wedge prisms. Since the working distance (or the distance between the measurement diffraction grating and a surface of the encoder head facing such grating) is practically determined by the angle of diffraction of the input beam at the grating and the input beam diameter such that the $1^{st}$ order diffracted beams are fully separated from the incident beam when the beams get back to the encoder head, the limitation on the positioning of the birefringent wedges with respect to the input beam necessarily defines the lower value of the working distance. The lower limit on the working distance, in turn, leads to a lower limit on dimensions of the isotropic glass block used in construction of the encoder head of US Provisional Application 62/416,847 and, therefore, causes a larger overall size of the encoder head. (In one example, when the beam diameter goal is 4 mm and the grating pitch (of about 1 micron) and wavelength (632.8 nm) are nominally fixed, the first order diffraction angle is about 39.3°, and the size of the footprint of the cube is about 15×15 mm$^2$. In comparison with such related art, the footprint of the cube of the embodiment in identical conditions is only about 10×10 mm$^2$).

Figure 1:
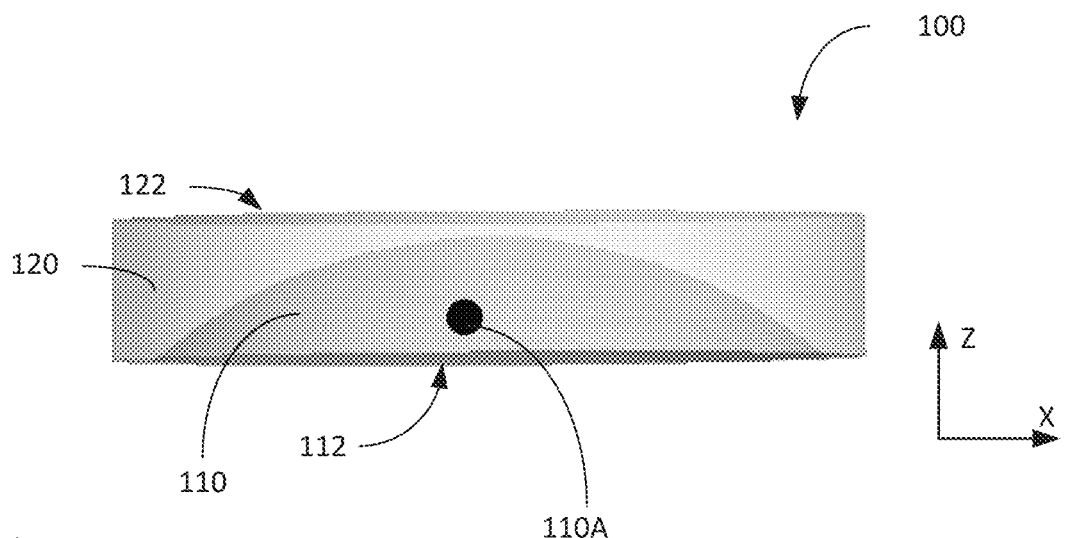
FIG. 1 is a schematic diagram of an optical doublet containing an optically-birefringent lens element.

The present embodiments may avoid such encoder-head size limitation by employing a birefringent lens element and, in particular, an optical doublet lens containing at least one birefringent lens element. As shown in the non-limiting example of FIG. 1, lens 100 includes a lens element 110 made of optically birefringent material (such as quartz, for example) with the crystal axis 110A (which in FIG. 1 is shown to be parallel to y-axis). The (outer) surface 112 of the lens 100 (which, in the example of FIG. 1 is the outer surface of the lens element 110, the farthest from the source of light, in operation of the embodiment) is curved (that is, not flat) such that any stray light beam reflected by this surface has a curvature mismatch and propagates in a different direction as compared with light beam incident onto this surface. As a result, the impact of the stray beam on phase errors in measurement of the wafer-stage positioning with respect to the encoder head is minimized.

The birefringent lens element 110 is operationally mated with the lens element 120 to form the optical doublet 100 such that the respective inner surfaces 114, 124 of the constituent lenses 110, 120 (that is, inner surfaces of the components of the doublet) are substantially congruent with one another. The outer surface 122 of the lens 100 (which in the example of FIG. 1 is the outer surface of the lens element 120, closest to the source of light in operation of the embodiment) is made flat. In one embodiment, the element 120 is made of an isotropic material (for example, glass) chosen to have a refractive index that is close in value to the average of $n_e$ and $n_o$ indices of the material of the element 110. (For instance, the value of such refractive index can be chosen with a deviation of +/−0.25% or less from the average of the $n_e$ and $n_o$ indices). In one example, when the material of the element 110 is crystalline quartz, the material of the element 120 may be chosen to be S-TIL1 glass. This way, the overall lens 100 (that is the lens formed by the combination of the elements 110 and 120) has an optical power value that is substantially close to zero (in one example, within the range of +/−0.001 diopters), while, at the same time, the overall lens 100 does refract the light beam, that traverses it, differently depending on the state of polarization state of such beam. In particular, a skilled artisan will readily appreciate that, in a specific case, the lens 100 includes an optical doublet lens having a first optical power corresponding to light having a first state of polarization and a second optical power corresponding to light having a second state of polarization. Here, the first and second states of polarization are transverse with respect to one another, and an average value of the first and second optical powers is substantially zero.)

Parameters of one non-limiting embodiment of the lens 100 are provided, for reference, in Table 1.

TABLE 1

| Surface | Radius of Curvature (mm) | Center thickness (mm) | Material | Diameter (mm) |
|---|---|---|---|---|
| 122 | Inf | 0.3 | S-TIL1 | 12 |
| 124, 114 | 8.33 | 1.95 | Quartz | 12 |
| 112 | 10000 | | Air | 12 |

In a related embodiment, element 120 can be also made from a birefringent optical material (for example quartz) such that the double lens 100 includes two optically-birefringent lens elements. In such implementation, the crystal axis of the element 120 may be chosen to be oriented along an axis that is generally transverse (and in a specific case—orthogonal) to the crystal axis 110A of the element 110.

In one implementation, the lens 100 is disposed in the exposure tool such that the curved surface 112 is facing the wafer-stage (and the measurement optical surface such as a surface of the diffraction grating carried by the wafer-stage). In a related embodiment, the orientation of the lens 100 with respect to the wafer stage may be reversed.

Figure 2A:
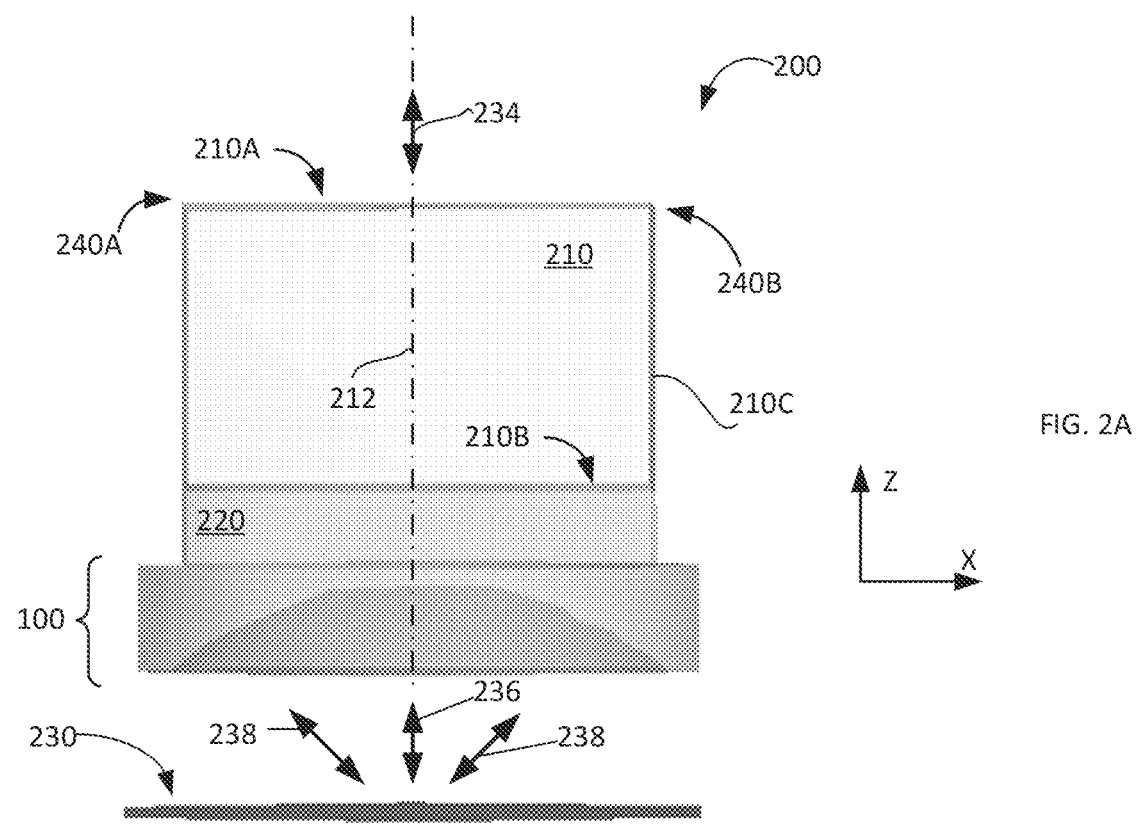
FIGS. 2A, 2B are side and perspective views of a kernel of an embodiment of an encoder head, including the optical doublet of FIG. 1 and an optically-transparent cuboid, separated by an optically-birefringent prismatic element (in one specific case—a birefringent optical plate)
Figure 2B:
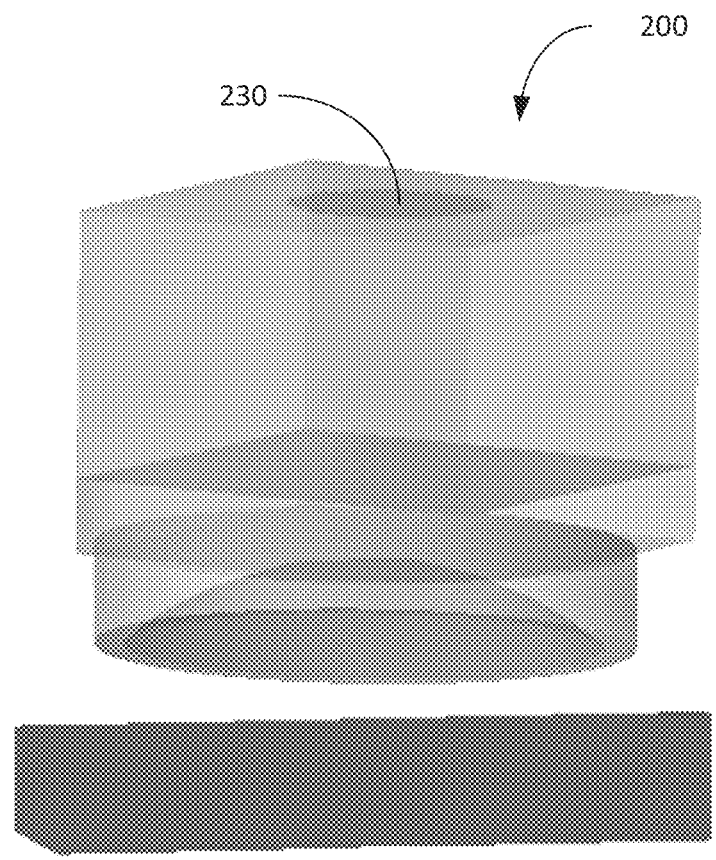

FIGS. 2A, 2B show the measurement 'pod' 200 of the encoder head employing a substantially perfect optically isotropic optically-transparent block 210 (cuboid made of glass, in one embodiment, or an optical grade of plastic material) with an upper surface 210A and a bottom or lower surface 210B, the latter facing the embodiment 100 of the lens. In the overall structure of the encoder head, the block 210 is placed between the lens 100 and the component(s) configured to operate as an input/output sub-system, delivering the input light to the block 210 and the lens 100 and collecting the light emanating from the pod 200 as the output light. (In one embodiment, the input/output optical circuitry is configured analogously to the embodiment described in reference to FIGS. 7B, 7C of the U.S. Ser. No. 15/800,480, and for that reason will not be discussed here in any sufficient detail). The block 210 and the lens 100 are further complemented by a birefringent prismatic element 220, which is disposed between the block 210 and the lens 100, as a result of which the pod 200 includes a combination of the block 210, the element 210, and the lens 100. The orientation of the 'pod' 200 of the encoder head with respect to the wafer-stage carrying the optical surface 230 (in one case—a diffraction grating) is such that the lens 100 is facing the surface 230, while the block 210 is separated from the surface 230 by the lens 100.

The pod 200 is disposed in the encoder head at such a location and in such orientation as to receive a measurement input beam of light (delivered substantially co-axially with respect to the axis 212 of symmetry of the block 210) and shown schematically with an arrow 234) from an input/output optical circuitry of the encoder head (disposed above the block 210 in FIG. 2A and not shown here for simplicity of illustration) at the upper surface 210A, transmit the input beam through the bottom surface 210B towards and through the prismatic element 220 and towards and through the central, axial portion of the lens 100, and further towards the surface 230, as shown schematically by the arrow 236. Line 210C illustrates a vertical edge of the block 210. The portion(s) 238 of input light 234, which has interacted with the surface 230, are re-directed back towards and through the lens 100 (more particularly, through its peripheral annular portion), through the element 220 and the bottom surface 210B of the block 210 towards the upper corners of the block 210, shown here as 240A, 240B in side view of FIG. 2A. Retroreflected internally at the corners 240A, 240B, the light is then returned, again, through the combination of the block 210, element 220, and the lens 100 towards the surface 230 yet again (see arrows 238) and, upon the second interaction with the surface 230, sent back to the input-output optical circuitry substantially along the axis 212. Each of the arrows in FIG. 2A is not necessarily precisely directed with respect to the chosen coordinate system, and is shown only for illustration and discussion purposes.

Generally, the prismatic element 220 is configured such that a state of polarization of light incident onto the element 220 normally to its surface is not changed upon transmission through the element 200 while, at the same time, a state polarization of light incident onto the element 220 obliquely is changed upon transmission through the element 200. (The effect of maintaining the state of polarization of light incident onto the element 220 normally to its surface is achieved as a result of rotation, of the corresponding vector of polarization, by an angle corresponding to a change in phase equal to an integer number of 2*pi radians). In one implementation, the birefringent prismatic element 220 is configured as described in U.S. patent application Ser. No. 15/800, 480, in that this prismatic element operates as a quarter-wave plate (QWP) when the light beam travels through it at a specific angle (corresponding to the refracted $1^{st}$ order diffracted beam), while at normal incidence it delays either polarization with respect to the other by an integer number of 2*pi in phase. Phrased differently, the vector of polarization of light incident onto the element 220 normally is maintained and not changed as a result of propagation of such light through the element 220, while the vector of polarization of light incident onto the element 220 at an angle different from 90 degrees is changed (re-oriented) as a result of propagation of such light through the element 220. This is discussed further below. FIG. 2B provides an illustration similar to that of FIG. 2A, but in a perspective view and, in addition, indicates a diameter 240 of the input (measurement) beam entering the encoder-head pod 200 during the operation of the head in the lithographic exposure tool.

Figure 3:
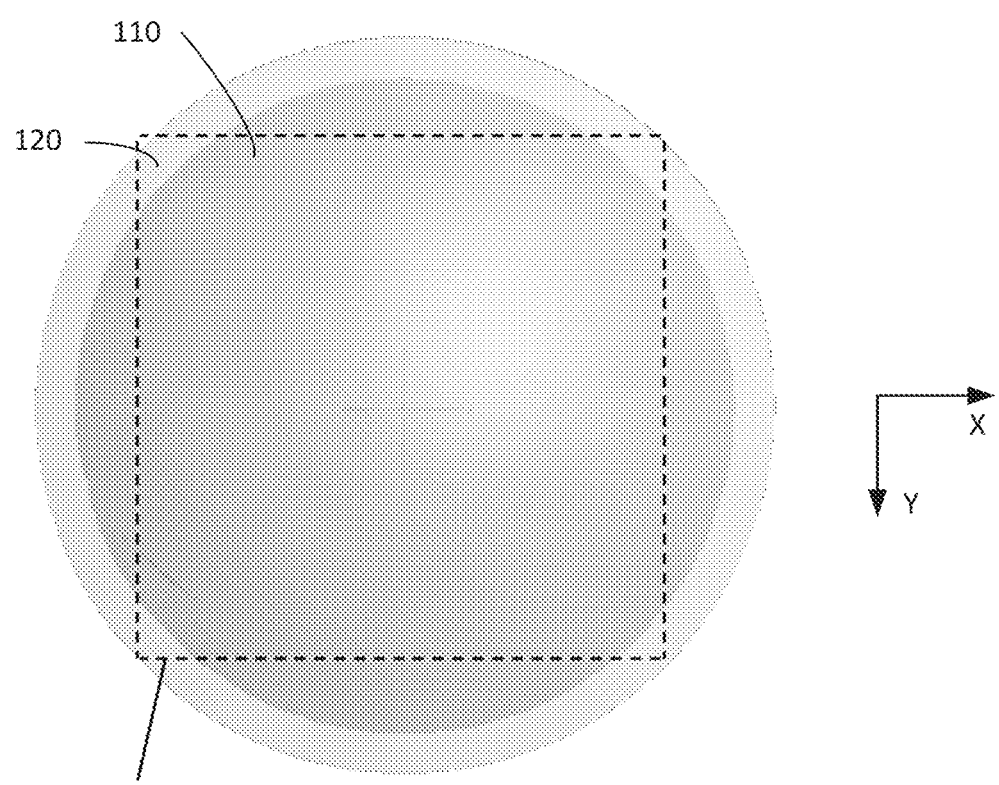
FIG. 3 illustrates, in bottom view, an embodiment of the lens of FIG. 1 with indication of an outer rectangular perimeter along which such lens can be trimmed.

Although the lens 100 is shown to have a circular outer perimeter in FIGS. 1, 2A, 2B its aperture could be trimmed down to match the rectangular (in one-case: 10×10 mm$^2$) footprint of the glass block 210 in the x- and y-dimensions. This is illustrated in FIG. 3, showing the outer rectangular perimeter 310 of the "trimmed" incarnation of the lens 100.

Figure 4:
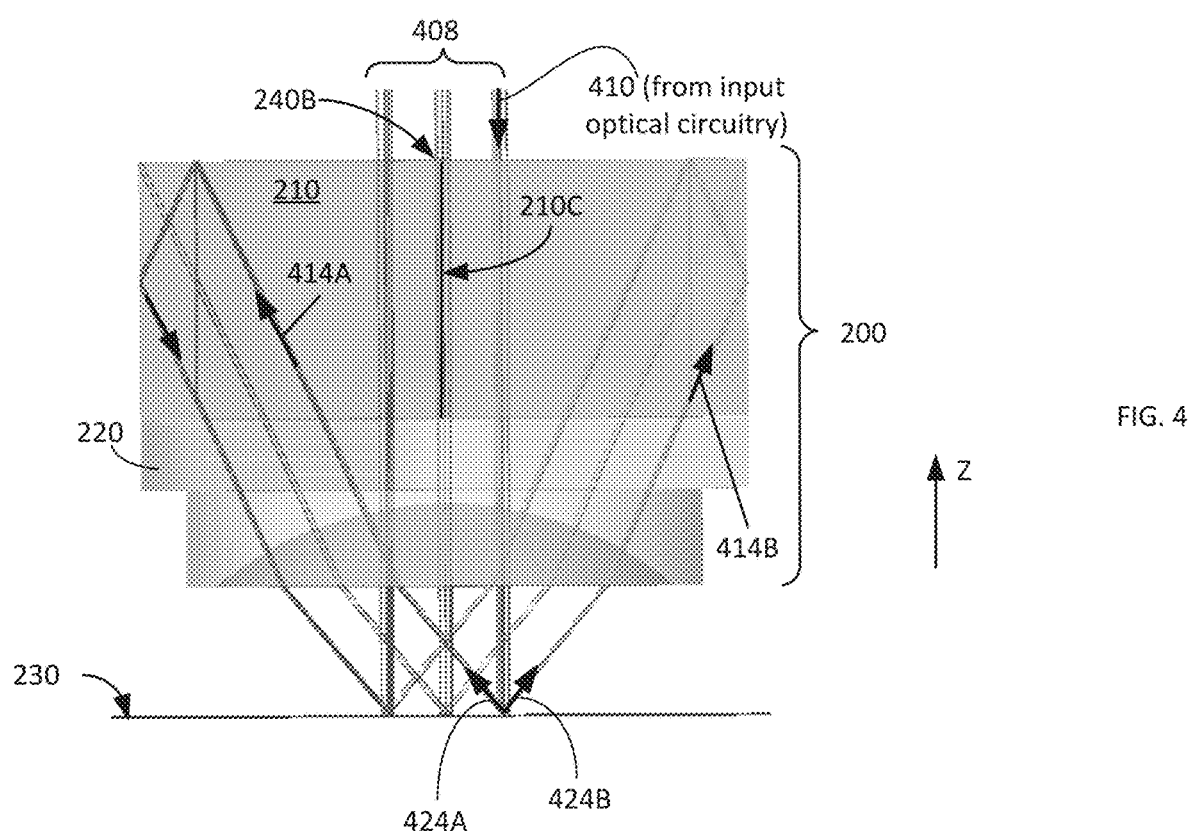
FIG. 4 illustrates propagation of measurement beam(s) of light through an embodiment of the kernel of the encoder head of FIGS. 2A, 2B, respectively, in side and perspective views.

FIG. 4 provides a more-detailed illustration of the spatial coordination of the components of the embodiment of the encoder head, structured according to the idea of the invention, and shows schematically a 4 mm diameter input beam 408 of light (a ray 410 of which is expressly identified) travelling through the system 200, viewed along an axis that forms 45 degree angles with both x- and y-axes of FIG. 2A. Notably, FIG. 4 illustrates the operation of the embodiment as seen in a first plane containing the z-axis and passing through two opposite corners of the surface 210A, only (while the embodiment behaves and/or operates on light 410 in a similar fashion in the second plane that contains the z-axis and is perpendicular to the first plane).

The system 200 is configured such that internal corners of the isotropic glass block 210 (such as the corner 240A) retroreflect the portion(s) 414A, 414B (of the input beam 410) that are incident onto these corners internally with respect to the block 210 through the bottom surface) back towards the optical surface 230. The light portion(s) 424A, 424B are formed as a result of re-directing portions of the input light 410 (after such input light was transmitted through the pod 200) back towards the pod 200 upon interaction of the so-transmitted light with the surface 230 for the first time.

When the optical surface 230 is configured as the surface of the diffraction grating, the beams 424A, 424B representing diffraction orders (formed at the $1^{st}$ pass of the input beam 408 by or off the grating) traverse the lens 100, enter the block 210 through its bottom surface 210B, and are further retroreflection inside the block 210, interact with the grating during a second pass off the grating (this time, with a polarization state that is orthogonal to the polarization state of the input beam 410). The modification of the polarization state is caused by the presence of the birefringent prismatic element 220 (traversed by light beams twice). The retroreflected within the block 210 light beams 414A, 414B are returned to the grating at angles generally different from the angles at which the diffraction orders 424A, 424B were formed by the grating during the $1^{st}$ pass of light by the grating. This effect is caused by the presence of the birefringent doublet lens 100 (traversed by light beams twice in orthogonal polarization states).

Referring again to the birefringent prismatic element 220, generally configured as an optical plate, the thickness of such element (which is configured to operate as a quarter-wave plate for the +1/−1 order diffraction measurements beams propagating within the embodiment 200 after the first pass of the measurement input light 408 off of the grating surface 230) is determined by the material properties of the plate 220 itself and the birefringent characteristics of the lens 100. In one example, the plate 220 is made of quartz, with no of about 1.5426 and no of about 1.5517 at an example wavelength of 632.8 nm, and a grating pitch of 1 um.

Figure 10A:
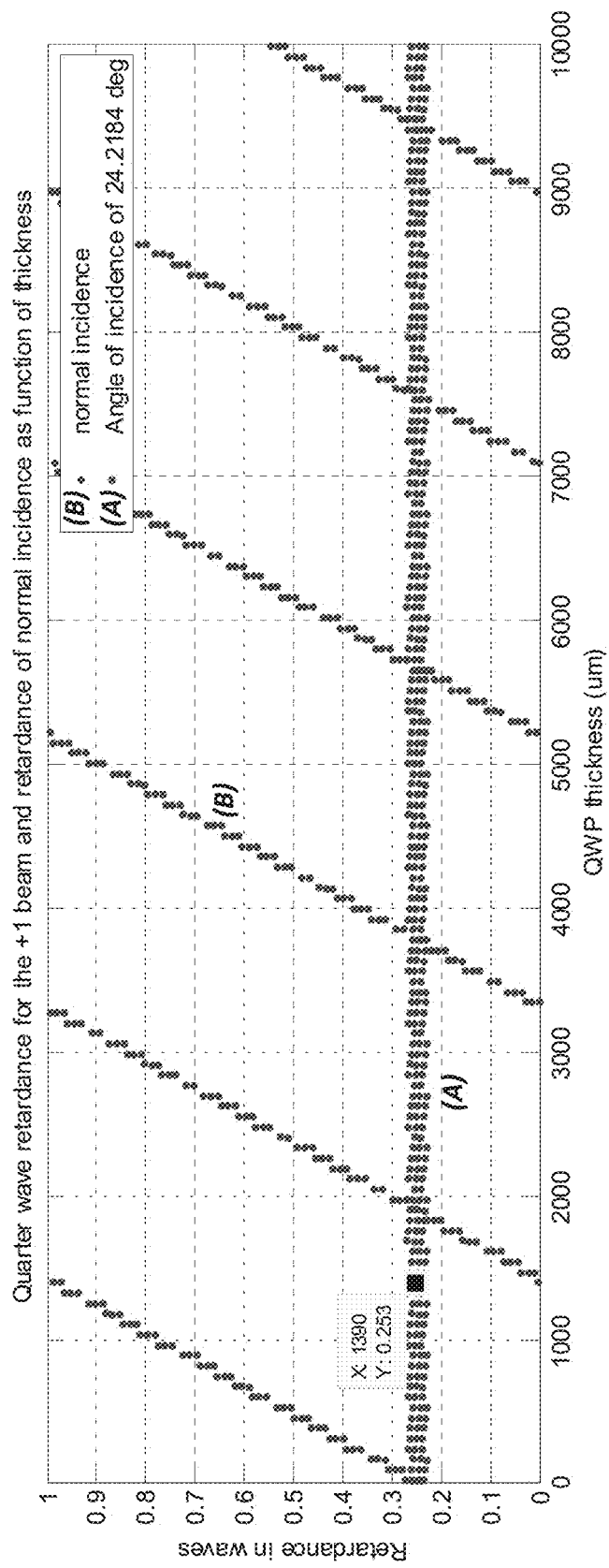
FIG. 10A contains a plot illustrating optical retardation provided by the plane-parallel birefringent plate of FIG. 2A (configured as a quarter-wave plate for a non-zero angle of incidence thereon of a +1/−1 diffraction order measurement sub-beams) and a plot showing a thickness-dependent optical retardation in the same plate corresponding to the normal incidence of light onto the plate as a function of thickness.
Figure 10B:
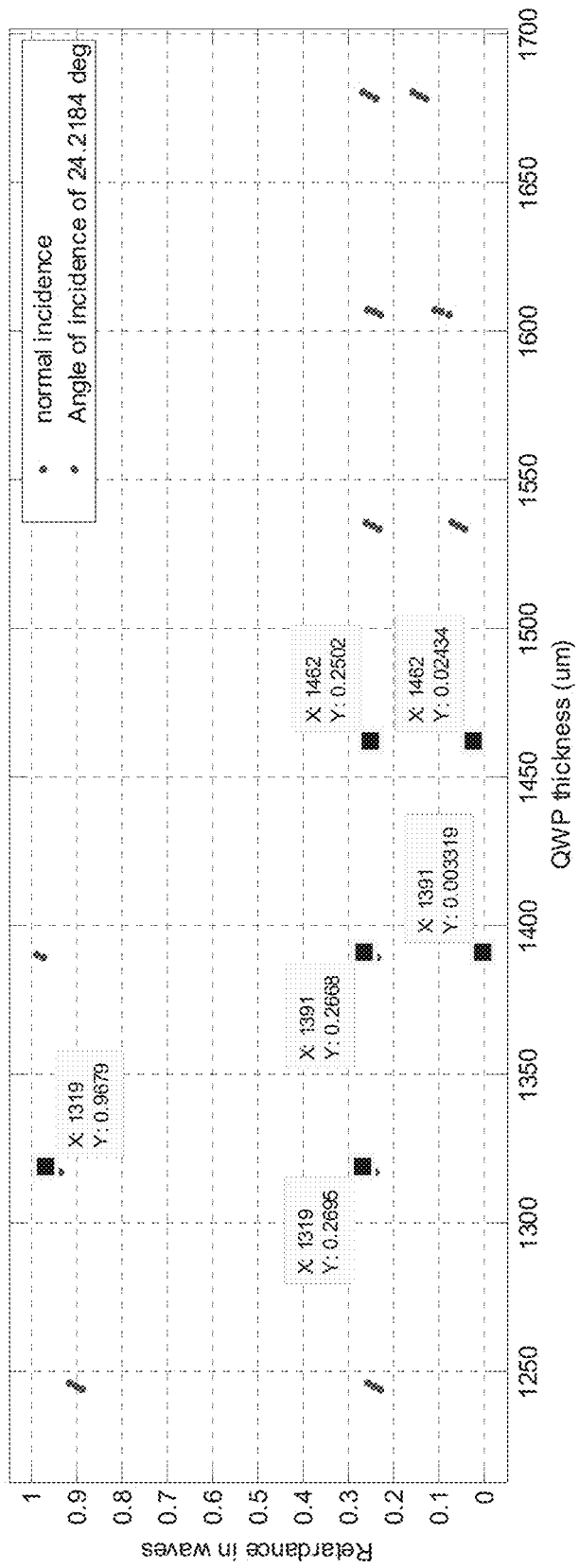
FIG. 10B a portion of the plots of FIG. 10A, for a nominal thickness of the plate of FIG. 2A of about 1.67 mm. As indicated, in this specific non-limiting example the actual thickness of the QWP needs to be either of the three identified values to obtain a waveplate-like performance at a specified non-zero angle of incidence with the desired non-polarizing properties at the normal (zero-angle) incidence for the wavelength chosen.

FIG. 10A shows the measure of optical retardation (expressed, in optical waves at the wavelength of about 632.8 nm, for light at ordinary and extraordinary polarizations) caused by the quartz plane-parallel plate. Plot (A) illustrates such measure for the case when light at 632.8 nm is incident onto the quartz plate at an angle (in air) of about 24.2 degrees (which corresponds to the beam 424B, that was diffracted by the grating at about 39.257°). For such light, the quartz plate 220 operates as a quarter-wave plate by design (as already discussed above). Plot (A) is formed by the discrete set of data points (thickness values) corresponding to a beam retardation of a quarter wave of retardation (within a practical error of about +/−2%) caused by the plate 220 for the chosen angle of incidence inside the quartz plate. The second plot of FIG. 10A—plot (B)—shows the optical retardation measure for a beam of light at 632.8 nm incident onto the plate normally (for the same discrete values of thickness determined for plot (A), presented within the range from 0 to 1 waves). In practice, therefore, this plot (B) corresponds to the optical retardation imposed by the plate 220 on the beams 424A, 424B for all of the potential plate thicknesses that give a quarter wave retardation at the chosen internal angle of propagation. (Alternatively or in addition, plot (A) may be thought of as one corresponding to thicknesses of the quartz plate 220 that is configured as a QWP but for a specific angle of about 24.2 degrees. Then, for such thicknesses, plot (B) shows the phase delay for a normally incident beam of light. Note that for both plots, the fractional waves of retardation is all that is shown: in practice, there are many full waves of retardations corresponding to each point on each plot.) A person of ordinary skill in the art will readily appreciate that, in choosing the practical thickness of the component 220, one should be guided by the thickness values that are determined at or around the points where the value of the plot (B) is either 0 or 1, which in this example are those about 1.39 mm, 3.27 mm or 5.216 mm. In the interest of making a practically-sized encoder head, the thinner value may be chosen in one implementation. Zooming in on that region of FIG. 10A (the results of which are shown in FIG. 10B), the thickness of the plate 220 can take one of a few values (shown as examples of 1.319 mm, 1.391 mm, or 1.462 mm; all values having been determined within an error range of about +/−1 micron, which is known to be within the reach of practical thickness tolerances achieved by manufacturers of commercial waveplates). Accordingly, in related embodiment the quartz plate 220 having thickness of 1.319 mm, 1.391 mm, or 1.462 mm is configured to implement a QWP for the +1 and −1 diffracted beams 424A, 424B, while, at the same time, to act like a regular optical window (introducing only an integer number of wave of phase delay; in other words, no fractional waves of delay) for a nearly-normally incident light of the beam 408, 410.

It should be noted that as the surface 230 of the stage grating tilts, the angle of incidence of the diffracted beams 424A, 424B at the birefringent plate 220 change, and therefore the optical retardation introduced by the plate 220 changes as well. The thicker the QWP 220, the larger the change of the optical retardation with tilt-angle. For a quartz plate, the measure of such change in retardation is about (0.005λ/degree*mm). Therefore, for a 1.4 mm thick plate with a tilt change of +/−1 mrad (full range of 0.11°, which is within the typical tolerance of the angular positioning of the workpiece-stage in a lithographic exposure tool, for example), the total change in optical retardation is 0.005λ*1.4*0.11=0.0008λ full range. Such practically-negligible amount of the change in the value of optical retardation introduced by the component 220 convincingly demonstrates the operational stability of the embodiment with respect to the tip or tilt of the workpiece-stage carrying the grating with the surface 230.

Figure 5:
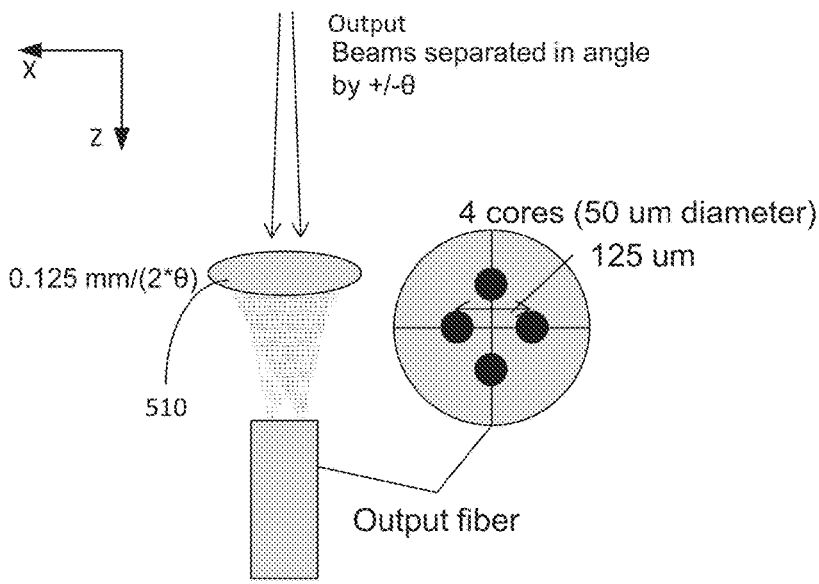
FIG. 5 shows an example of the optical-fiber based output portion of the optical circuitry that can be employed with an embodiment of the encoder head.
Figure 6:
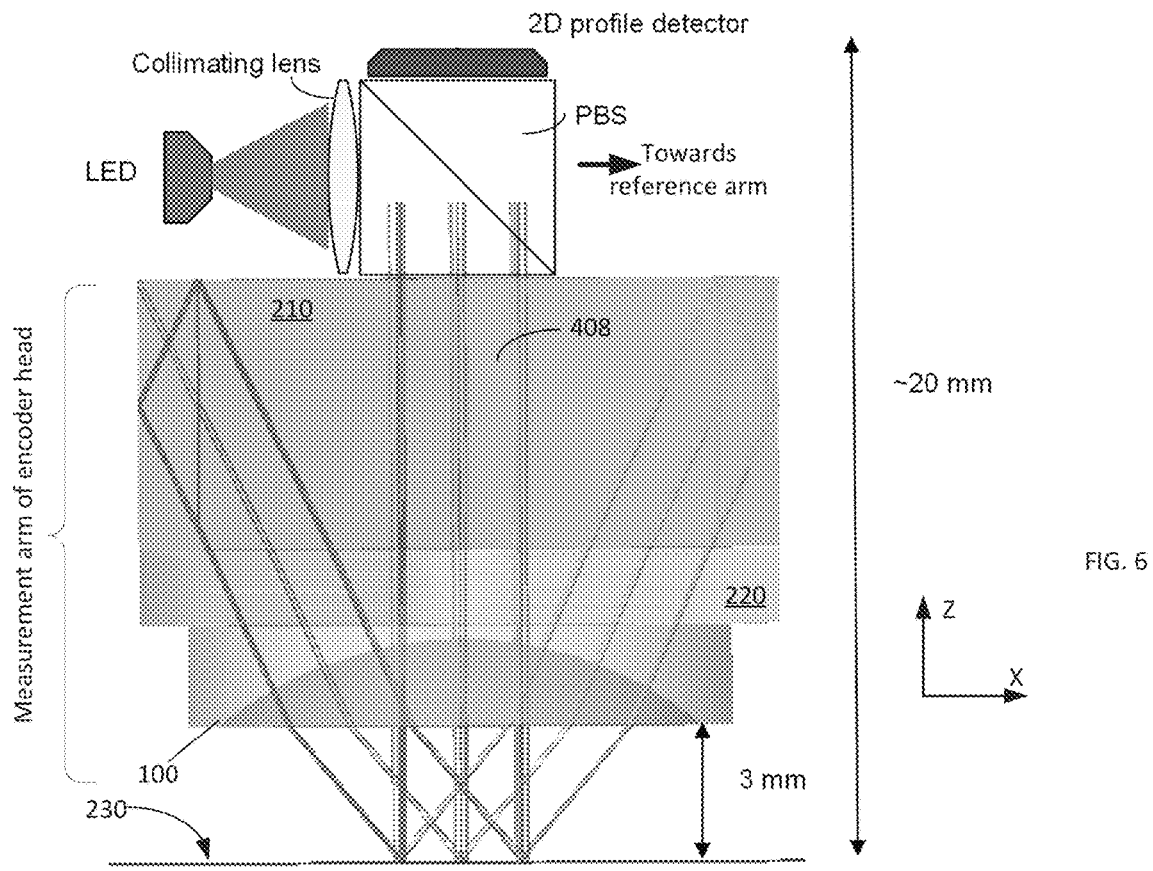
FIG. 6 illustrates some details of a measurement arm of an embodiment of the encoder head.

Understandably—and in reference to the principle of operation of the embodiment as would be seen in the yz-plane—when the optical surface 230 is that of a 2D diffraction grating, there is another pair of measurement sub-beams formed as diffraction orders in yz-plane (in and out of the page in the view of FIG. 4). The propagation of these beams through the system and the change of the polarization states of light upon such propagation are substantially similar to those discussed above. The end result of the twice-diffracted beams (for all 4 measurement sub-beams) is that, upon having interacted with the grating twice, each of them leaves the 2D grating through the central portion of the lens 100 and the central portion of the element 220 towards the block 210, to form a corresponding output beam. Due to the general symmetry of the input/output optical circuitry (discussed in reference to FIGS. 7B, 7C of the U.S. Ser. No. 15/800,480), all four output beams are oriented substantially symmetrically about the input beam and about the axis of symmetry 212 of the block 210 and inclined with respect to the axis 212 at substantially equal angles. Phrased differently, the wavevectors corresponding to the four output beams are all pointing in different directions while, at the same time, each of the wavevectors forms the same-magnitude angle with the axis 212. That way these output beams can be coupled into 4 separate output fibers (forming the output portion of the input-output circuitry) by a single outcoupling lens 510, as shown schematically in FIG. 5. Prior to such outcoupling, these four output measurement beams are made to interfere with the respectively-corresponding reference beams generated by a reference 'pod' (that is similar to the measurement 'pod' 200 and that is disposed in the reference arm of the encoder head, FIG. 6). The reference diffraction grating, corresponding to the reference arm of the encoder head, is spatially fixed (as part of the encoder head), unlike the movable grating with the surface 230, located generally on the wafer-stage.

Referring again to FIGS. 4, 6, a skilled artisan shall immediately recognize an operational advantage of the embodiment(s), which stems from the reduced working distance (for a given diameter of the input beam 410) as compared to that of encoder heads of related art. For a 4 mm diameter input beam 408, for example, the required working distance is only about 3 mm (a reasonable safety margin to prevent the grating/stage from crashing into the encoder head), and, at the same time, the $1^{st}$ order diffracted measurement sub-beams interact with the diffraction grating in the same area that is irradiated by the light from the measurement input beam 408,410 incident on the diffraction grating. In other words, in practice the measurement sub-beams overlap the measurement incident beam at the bottom surface of the encoder head (element 110, surface 112). This advantage is achieved due to the fact that a single, spatially-continuous birefringent element 220 is used across the bottom surface of the block 210 such that the input beam 210 traverses the element 220 before it reaches the grating 230 (in contradistinction with the situation described in U.S. provisional application 62/416,847).

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

For example, a reference to an identified vector or line or plane being substantially parallel to a referenced line or plane is to be construed as such a vector or line or plane that is the same as or very close to that of the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). For example, a reference to an identified vector or line or plane being substantially perpendicular to a referenced line or plane is to be construed as such a vector or line or plane the normal to the surface of which lies at or very close to the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). For example, a term "substantially-rigid", when used in reference to a housing or structural element providing mechanical support for a contraption in question, generally identifies the structural element that rigidity of which is higher than that of the contraption that such structural element supports. As another example, the use of the term "substantially flat" in reference to the specified surface implies that such surface may possess a degree of non-flatness and/or roughness that is sized and expressed as commonly understood by a skilled artisan in the specific situation at hand. Other specific examples of the meaning of the terms "substantially", "about", and/or "approximately" as applied to different practical situations may have been provided elsewhere in this disclosure.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

In addition, it is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

The operation of embodiments of the invention may include—even if not expressly shown in the accompanying drawings—a specifically-programmed computer-readable processor controlled by instructions stored in a tangible, non-transitory storage memory. Such processor may be appropriately programmed to govern the operation of the embodiment and/or collect data acquired during such operation, in order to extract and process information pertaining to a given measurement conducted during the operation of the embodiment. The memory may be random access memory (RAM), read-only memory (ROM), flash memory or any other memory, or combination thereof, suitable for storing control software or other instructions and data. Instruction information may be conveyed to a processor through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

Disclosed aspects, or portions of these aspects, may be combined or modified in ways not listed above. For example, in an embodiment related to that of FIG. 1, the orientation of the lens 100 as a whole may be reversed, in that the surface 112 may be placed to face in the opposite direction. In another related embodiment, the lens element shown as 120 and facing the input beam of light can be configured as a birefringent lens element, while the lens element shown as 110 can be made optically isotropic. In yet another implementation, the surface 122 of the lens 100 need not be a flat surface, but may be, for example a curved (convex or concave) surface. Alternatively or in addition, the overall lens 100 can be devised to ensure that the average optical power of this lens (determined from the values of optical powers at different states of polarization of light) differs from the zero value. Alternatively or in addition, the inner surface 114 of the birefringent lens element 110 and the inner surface 124 of the lens element 120 need not be cemented to each other but, instead, there may be a spacing between the inner surface 114 and the inner surface 124. A boundary surface formed by the inner surfaces 114, 124 may not be a curved surface. In reference to FIGS. 2A, 2B, instead of the substantially perfect optically isotropic optically-transparent block 210, multiple optically isotropic optically-transparent blocks may be provided in contact with each other but only for the purpose of producing the same optical effect as that facilitated by the single optical block 210. These multiple blocks may be cemented or optically contacted to each other to form a figure defined by the block 210.

Accordingly, the invention should not be viewed as being limited to the disclosed embodiment(s).

The invention claimed is:

1. An optical system comprising:
   a first optical sub-system including a combination of a substantially geometrically-perfect optically-isotropic cuboid and a lens, said lens containing at least one birefringent lens element that has a non-zero optical power for polarized light; and
   an optical surface disposed in optical communication with said cuboid to form a first beam of light by redirecting a portion of an input beam of light, which has traversed the first sub-system once and which is incident at a first chosen area of the optical surface, towards the first sub-system.

2. The optical system according to claim 1, wherein the at least one birefringent lens element includes first and second birefringent lens elements having, respectively, first and second crystal axes, the first and second crystal axes being transverse to one another.

3. The optical system according to claim 1, configured to form a second beam of light including light, from the first beam of light, that has been reflected by the first sub-system back towards the optical surface; and
   wherein the optical system is further configured to cause the second beam of light to interact with the optical surface at a second chosen area of the optical surface, the first and second chosen areas overlapping one another.

4. The optical system according to claim 3, wherein the first and second chosen areas are substantially congruent.

5. The optical system according to claim 3, configured to form, from the input beam of light incident onto said cuboid and having a first state of polarization, an output beam of light having a second state of polarization,
   wherein the output beam of light is formed from the second beam of light as a result of interaction between the optical surface and the second beam of light;
   wherein the first and second states of polarization are substantially orthogonal to one another.

6. The optical system according to claim 1,
   wherein the optical system has an axis of symmetry,
   wherein, when said optical surface is a surface of a two-dimensional diffraction grating, the optical system is configured to form four output beams of light as a result of diffracting light, from the input beam of light, twice at said optical surface, and wherein wavevectors corresponding to said four output beams of light are inclined at the same angle with respect to the axis of symmetry.

7. The optical system according to claim 6, configured to propagate the input beam and the output beam at a non-zero angle with respect to one another.

8. The optical system according to claim 1, wherein the optical surface is positioned to form the first beam of light from the input beam of light after the input beam of light has traversed both the substantially geometrically-perfect optically-isotropic cuboid and the lens along an axis of the first sub-system.

9. The optical system according to claim 1, wherein said optical surface includes a surface of a diffraction grating.

10. The optical system according to claim 1, wherein the lens includes an optical doublet lens having a first optical power corresponding to light having a first state of polarization and a second optical power corresponding to light having a second state of polarization, wherein the first and second states of polarization are transverse with respect to one another, and wherein an average value of the first and second optical powers is substantially zero.

11. The optical system according to claim 1, wherein a first outer optical surface of the lens is substantially planar, and wherein a second outer optical surface of the lens is curved, the first and second outer surfaces being surfaces of different constituent lens elements of said lens.

12. The optical system according to claim 1, wherein the lens is axially symmetric but, at the same time, is not rotationally symmetric.

13. The optical system according to claim 1, wherein said cuboid has an axis of symmetry, and wherein the lens is axially symmetric about said axis.

14. The optical system according to claim 1, further comprising a birefringent prismatic element disposed between said cuboid and said lens.

15. The optical system according to claim 14, wherein said birefringent prismatic element includes a birefringent plane-parallel plate configured
to maintain a vector of polarization of light, incident onto said plate perpendicularly to a surface of said plate, upon transmission of such light through said birefringent plane-parallel plate while, at the same time,
to change a vector of polarization of light incident onto said surface obliquely.

16. A lithographic exposure system comprising the encoder head configured according to claim 1, and further comprising a moveable stage carrying a diffraction grating.

17. A lithographic exposure system comprising the encoder head configured according to claim 16, and further comprising a moveable stage carrying a diffraction grating.

18. The optical system according to claim 1,
wherein the at least one birefringent lens element has a first non-zero optical power for a first light having a first state of polarization and a second non-zero optical power for a second light having a second state of polarization,
wherein the first and second states of polarization are different from one another.

19. An encoder head configured for use in a lithographic exposure tool that includes a wafer-stage carrying a diffraction grating, the encoder head comprising:
an optically-isotropic cuboid, and
a birefringent lens having a non-zero optical power for polarized light.

20. The encoder head according to claim 19, wherein said cuboid is a substantially geometrically perfect optical cuboid and said birefringent lens includes an optical doublet lens.

21. The encoder head according to claim 20, wherein a first outer surface of said optical doublet lens is substantially planar, and wherein a second outer surface of said optical doublet lens is curved.

22. The encoder head according to claim 19, wherein the birefringent lens is axially symmetric but, at the same time, is not rotationally symmetric.

23. The encoder head according to claim 19, wherein the birefringent lens includes a first lens element and a second lens element, the first lens element made of optically anisotropic material having a first crystal axis, the second lens element made of optically isotropic material.

24. The encoder head according to claim 23, wherein the optically anisotropic material has an ordinary refractive index and an extraordinary refractive index, and wherein a refractive index of the optically isotropic material is substantially equal to an average of the ordinary refractive index and the extraordinary refractive index.

25. The encoder head according to claim 19, wherein the birefringent lens includes a first lens element and a second lens element, the first lens element made of a first optically anisotropic material having a first crystal axis, the second lens element made of a second optically anisotropic material having a second crystal axis.

26. The encoder head according to claim 25, wherein the first and second optical axes are substantially perpendicular to one another.

27. The encoder head according to claim 19, wherein said cuboid has an axis, and further comprising a birefringent prismatic element disposed substantially symmetrically about the axis and between the cuboid and the birefringent lens.

28. The encoder head according to claim 27, wherein the birefringent prismatic element is a plane-parallel plate configured to change a direction of a vector of linear polarization of light propagating therethrough at a non-zero angle to the axis and, at the same time, to maintain a direction of a vector of linear polarization of light propagating therethrough along the axis.

29. The encoder head according to claim 27, wherein a first outer surface of the birefringent prismatic element faces a substantially planar surface of the birefringent lens.

30. The encoder head according to claim 27, wherein the birefringent lens comprises an optically-isotropic lens element and a birefringent lens element, the optically-isotropic lens element disposed between the birefringent prismatic element and the birefringent lens element.

31. The encoder head according to claim 19,
wherein the birefringent lens has a first non-zero optical power for a first light having a first state of polarization and a second non-zero optical power for a second light having a second state of polarization,
wherein the first and second states of polarization are different from one another.

32. An encoder head for use in a lithographic exposure system in optical communication with a diffractive grating of the exposure system, the encoder head comprising:
a first optical sub-system containing a combination of
a single, substantially geometrically perfect cuboid of optically isotropic material, said cuboid having an axis;
an optically-birefringent plane-parallel plate disposed substantially symmetrically about the axis; and
an optically-birefringent lens disposed symmetrically about the axis and having a non-zero optical power for polarized light;
wherein the first optical subsystem is positioned
to transmit light from an input light beam, delivered to the encoder head along the axis,
to interact with the diffractive grating for a first time at a first area on a surface of the diffractive grating and, as a result of such interaction,
to form a first beam of light directed from the diffraction grating to the first optical sub-system, and
wherein the first beam of light, that has traversed the first sub-system twice, is incident at the diffraction grating to interact with the surface of the diffraction grating for a second time at a second area, the first and second area overlapping each other.

33. The encoder head according to claim 32, wherein the birefringent plane-parallel plate is configured to change a direction of a vector of linear polarization of light propagating therethrough at a non-zero angle to the axis and, at the same time, to maintain a direction of a vector of linear polarization of light propagating therethrough along the axis.

34. The encoder head according to claim 33, wherein said birefringent plane-parallel plate is disposed substantially parallel to a facet of said cuboid.

35. The encoder head according to claim 32, wherein said birefringent plane-parallel plate is disposed between said cuboid and said birefringent lens.

36. The encoder head according to claim 32, wherein a first projection area, a second projection area, and a third projection area are substantially congruent,
   wherein the first projection area is defined by a projection of said cuboid along the axis onto a chosen plane, the second projection area is defined by a projection of said birefringent prismatic element along the axis onto the chosen plane, and the third projection is defined by a projection of said birefringent lens element along the axis onto the chosen plane.

37. The lithographic exposure system comprising the encoder head configured according to claim 32, and further comprising a moveable stage carrying said diffraction grating.

38. The encoder head according to claim 32,
   wherein the optically-birefringent lens has a first non-zero optical power for a first light having a first state of polarization and a second non-zero optical power for a second light having a second state of polarization,
   wherein the first and second states of polarization are different from one another.

* * * * *

UNITED STATES PATENT AND TRADEMARK OFFICE
CERTIFICATE OF CORRECTION

PATENT NO. : 10,591,826 B2  
APPLICATION NO. : 15/889412  
DATED : March 17, 2020  
INVENTOR(S) : Eric Peter Goodwin Page 1 of 2

It is certified that error appears in the above-identified patent and that said Letters Patent is hereby corrected as shown below:

In the Claims

Column 18:
Claim 1, Line 10:
"the first sub-system"
Should read:
-- the first optical sub-system --

Claim 3, Line 4:
"the first sub-system"
Should read:
-- the first optical sub-system --

Claim 7:
"The optical system according to claim 6, configured to propagate the input beam and the output beam as a non-zero angle with respect to one another."
Should read:
-- The optical system according to claim 5, configured to propagate the input beam of light and the output beam of light as a non-zero angle with respect to one another. --

Column 19:
Claim 23, Line 3:
"lens element, the first lens element made of optically"
Should read:
-- lens, element, the first lens element made of an optically --

Claim 23, Line 5:
"element made of optically"
Should read:
-- element made of an optically --

Signed and Sealed this
Eighteenth Day of August, 2020

Andrei Iancu
*Director of the United States Patent and Trademark Office*

CERTIFICATE OF CORRECTION (continued)
U.S. Pat. No. 10,591,826 B2

Column 20:
Claim 28, Line 3:
"figured to change a direction of a vector"
Should read:
-- figured to change a direction of a first vector --

Claim 28, Line 5:
"to maintain a direction of a"
Should read:
-- to maintain a direction of a second --

Claim 32, Line 6:
"optically isotropic material,"
Should read:
-- an optically isotropic material, --

Claim 33, Line 3:
"direction of a vector"
Should read:
-- direction of a first vector --